(12) United States Patent
Arnold et al.

(10) Patent No.: US 9,196,943 B2
(45) Date of Patent: Nov. 24, 2015

(54) MICROWAVE FILTER HAVING AN ADJUSTABLE BANDWIDTH

(71) Applicant: Tesat-Spacecom GmbH & Co. KG, Backnang (DE)

(72) Inventors: Christian Arnold, Backnang (DE); Jean Parlebas, Burgstetten (DE); Charles Thibaut, Stuttgart (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 215 days.

(21) Appl. No.: 14/059,017

(22) Filed: Oct. 21, 2013

(65) Prior Publication Data

US 2014/0111289 A1   Apr. 24, 2014

(30) Foreign Application Priority Data

Oct. 22, 2012   (DE) .......................... 10 2012 020 576

(51) Int. Cl.
| | | |
|---|---|---|
| *H01P 1/20* | (2006.01) | |
| *H01P 1/208* | (2006.01) | |
| *H03H 7/01* | (2006.01) | |
| *H01P 1/207* | (2006.01) | |
| *H01P 7/10* | (2006.01) | |

(52) U.S. Cl.
CPC .............. *H01P 1/208* (2013.01); *H01P 1/2082* (2013.01); *H01P 1/2086* (2013.01); *H03H 7/0138* (2013.01); *H01P 1/207* (2013.01); *H01P 7/105* (2013.01)

(58) Field of Classification Search
None
See application file for complete search history.

(56) References Cited

U.S. PATENT DOCUMENTS

| | | | | |
|---|---|---|---|---|
| 4,060,779 | A | | 11/1977 | Atia et al. |
| 4,513,263 | A | * | 4/1985 | Minnis ......................... 333/204 |
| 4,837,535 | A | * | 6/1989 | Konishi et al. ............... 333/210 |
| 5,220,300 | A | * | 6/1993 | Snyder ......................... 333/210 |
| 5,373,270 | A | * | 12/1994 | Blair et al. ................... 333/202 |
| 5,495,216 | A | * | 2/1996 | Jachowski .................... 333/208 |
| 5,781,085 | A | * | 7/1998 | Harrison ...................... 333/202 |
| 6,232,853 | B1 | * | 5/2001 | Goulouev ..................... 333/208 |
| 6,285,267 | B1 | * | 9/2001 | Hauth et al. .................. 333/210 |
| 6,806,791 | B1 | * | 10/2004 | Wang et al. ................... 333/134 |
| 7,167,065 | B2 | * | 1/2007 | Aiga et al. .................... 333/204 |
| 8,085,118 | B2 | | 12/2011 | Yu et al. |
| 8,836,450 | B2 | * | 9/2014 | Pari et al. ..................... 333/203 |
| 2003/0092577 | A1 | | 5/2003 | Hey-Shipton |
| 2004/0246078 | A1 | * | 12/2004 | Vigneron et al. ............. 333/208 |
| 2006/0028296 | A1 | * | 2/2006 | Yun et al. ..................... 333/126 |

FOREIGN PATENT DOCUMENTS

DE        28 45 050 A1    4/1980

* cited by examiner

*Primary Examiner* — Tuan T Lam
(74) *Attorney, Agent, or Firm* — Crowell & Moring LLP

(57) ABSTRACT

A microwave filter includes a first adjustable coupling resonator connected via a first coupling iris to an input of the microwave filter, a frequency resonator configured to establish a transmission frequency of the microwave filter and connected to the first adjustable coupling resonator via a second coupling iris, and a second adjustable coupling resonator connected to the frequency resonator via a third coupling iris.

14 Claims, 5 Drawing Sheets

MICROWAVE FILTER HAVING AN ADJUSTABLE BANDWIDTH

CROSS-REFERENCE TO RELATED APPLICATIONS

This application claims priority under 35 U.S.C. §119 to German Patent Application No. 10 2012 020 576.7, filed Oct. 22, 2012, the entire disclosure of which is herein expressly incorporated by reference.

FIELD OF THE INVENTION

The invention relates to a microwave filter, a signal multiplexer, and the use of a microwave filter.

BACKGROUND OF THE INVENTION

In communications satellites, input signals that are encoded in a plurality of frequencies are received via an input antenna, further processed, and usually emitted in another direction via an output antenna. In order to further process the signals, the received frequencies are split into frequency bands, for example, by means of bandpass filters, amplified, and recombined.

As a rule, these filters operate in the microwave range and must normally be able to process high-output signals with small losses. For example, waveguide filters may be used for this purpose in which a plurality of cavity resonators that are adjusted to the frequency band are coupled in series. Here, the cavity resonators are connected to one another via coupling irises (i.e., openings having a diameter that is smaller than the volume of the cavity resonators) that determine the width of the passband.

The bandwidth of a microwave filter is primarily a function of the quantity of the energy coupling between the resonators. In a typical waveguide filter arrangement, the portion of the coupling energy is determined by the size of the coupling iris between the resonators.

SUMMARY OF THE INVENTION

In some circumstances, it is desirable to be able to adjust the width of the processed frequency bands, for example, in order to be better able to distribute the output to be processed onto various channels. The microwave filters discussed above, however, cannot be adjusted with regard to their bandwidth. Although adjustable bandpass filters made of electronic components are known, the principles used there cannot simply be transferred to cavity resonators.

Exemplary embodiments of the present invention are directed to a microwave filter that can be used in a flexible fashion.

One aspect of the invention relates to a microwave filter comprising, for example, cavity resonators. The microwave filter may be embodied in such a way that it may be connected to a cavity conductor such as, for example, the cavity busbar of a multiplexer.

According to one embodiment of the invention, the microwave filter comprises a first adjustable coupling resonator connected to an input of the microwave filter via a first coupling iris; a frequency resonator designed to determine a transmission frequency of the microwave filter and connected to the first adjustable coupling resonator via a second coupling iris; and a second adjustable coupling resonator connected to the frequency resonator via a third coupling iris. The second coupling resonator may, for example, be connected to the output of the microwave filter, an additional resonator, or a cavity conductor via a fourth coupling iris.

A resonator may, in general, be a cavity that provides a volume in which the microwave signal, i.e., an electromagnetic wave, may oscillate.

A frequency resonator may be a resonant resonator that is particularly resonant with the transmission frequency.

A coupling resonator may be a resonator that is not coordinated with the transmission frequency and whose resonance frequency deviates strongly from the transmission frequency.

The coupling irises may be connections or openings between resonators that have a smaller diameter than the resonators. In particular, the coupling irises may be openings that are not adjustable or movable.

The resonance frequency of a resonator may be changed by adjusting the associated volume. For example, the volume may be increased and decreased using a plate slide. In the present case, the resonance frequency of an adjustable coupling resonator may be adjusted, for example, in that the volume of the coupling resonator is changed.

By changing or adjusting the resonance frequency of the coupling resonators, the bandwidth of the frequency band transmitted by the microwave filter (in that the microwave filter has a high transmission output), may be changed or adjusted.

In this manner, high outputs, for example, greater than 100 W and frequencies in the microwave range may be filtered with a relatively small amount of losses in an adjustable frequency band around a transmission frequency. The transmission frequency of the microwave filter may be defined as the medium frequency of the transmission frequency band.

Overall, the adjustment of the bandwidth of the microwave filter occurs with the aid of coupling resonators and not by the use of coupling irises. In addition, with the aid of adjustable couplings, the degradation of filter adaptation when adjusting the medium frequency may be counteracted by adapting the length of the frequency resonators.

A microwave filter having only one frequency resonator and two coupling resonators attached at the input and output of the microwave filter may be considered a so-called single-circuit filter. The rate of change of the transmission frequency band may be increased by the addition of more frequency resonators.

According to one embodiment of the invention, the microwave filter additionally comprises a second frequency resonator designed to establish a transmission frequency of the microwave filter and connected to the first frequency resonator via the second adjustable coupling resonator; and a third adjustable coupling resonator connected to the second frequency resonator. By means of a chain comprising a first coupling resonator, a first frequency resonator, a second coupling resonator, a second frequency resonator, and a third coupling resonator, a microwave filter in the form of a so-called dual-circuit resonator may be produced.

Chains or series having more than two (for example, three or four) frequency resonators may also be constructed by the addition of more pairs comprising one frequency resonator and one coupling resonator.

According to one embodiment of the invention, the microwave filter comprises a plurality (for example, 3, 4, or more) of frequency resonators with a coupling resonator connected between each of them.

According to one embodiment of the invention, the microwave filter comprises an additional coupling resonator between the frequency resonators, which represent an overcoupling for the purpose of generating the desired filter function. This overcoupling may, depending on the selection of the resonance frequency of the coupling resonator, have a positive or negative prefix. For example, it is possible for a coupling resonator to be inserted between the first and fourth frequency resonator for the purpose of realizing a negative overcoupling in order to realize a quasi-elliptical filter function.

According to one embodiment of the invention, at least one frequency resonator is adjustable. The frequency resonator(s) may also have an adjustable frequency. This may be implemented by an adjustable volume of the frequency resonator. In this manner, for example, it is possible to compensate for a shift in the medium frequency of the transmission frequency band, which may occur due to changes in bandwidth. Targeted adjustment of the medium frequency is also possible.

Overall, the microwave filter may be designed for the purpose of adjusting the bandwidth of the transmission frequency band and/or the medium frequency of the transmission frequency band.

According to one embodiment of the invention, at least one coupling resonator and/or at least one frequency resonator comprises an actuator by means of which a volume of the resonator may be adjusted. For example, an actuator may be assigned to each coupling resonator and/or each frequency resonator that is able to adjust the resonance frequency of the respective resonator. For example, the actuator may move a plate slide that forms a side wall of the resonator volume.

According to one embodiment of the invention, the actuator comprises an electromechanical actuator. The actuator may, for example, comprise a piezo element, a piezo motor, or a multiphase motor.

According to one embodiment of the invention, at least one frequency resonator is (or all frequency resonators are) embodied so as to be operable in TE011 mode. The volume and/or the interior shape of the frequency resonator may be embodied in such a way that only electromagnetic microwaves in the TE011 mode may be propagated at the transmission frequency in the resonator. TE modes (transversal electrical modes) are special wave shapes of the electromagnetic waves that propagate in the cavity conductors. In TE waves, only the electrical component disappears in the direction of propagation while the magnetic component may assume non-zero values.

According to one embodiment of the invention, at least one coupling resonator is (or all coupling resonators are) embodied so as to be operated in TE011 mode.

According to one embodiment of the invention, at least one coupling resonator is (or all coupling resonators are) embodied so as to be operated in TE111 mode.

According to one embodiment of the invention, a resonance frequency of a frequency resonator deviates from the transmission frequency by less than 10% of a bandwidth of a transmission frequency band. A frequency resonator may be characterized by the fact that it has a resonance frequency in the range of the transmission frequency.

According to one embodiment of the invention, a resonance frequency of a coupling resonator deviates from the transmission frequency by more than half the bandwidth of the transmission frequency band, for example, by more than one entire bandwidth. A coupling resonator may be characterized by the fact that it comprises a resonance frequency in the range outside of or on the edge of the transmission band.

According to one embodiment of the invention, a volume of a coupling resonator is less than a volume of a frequency resonator. In this manner, the difference resonance behaviors of the resonators may be realized.

According to one embodiment of the invention, at least two frequency resonators are embodied to be adjusted to various resonance frequencies. For example, two frequency resonators may be detuned from one another, which can increase the rate of change of the transmission band.

According to one embodiment of the invention, at least two coupling resonators are designed to be adjustable to various resonance frequencies. In other words, the coupling resonators may be adjusted independently of one another.

According to one embodiment of the invention, the microwave filter comprises at least one overcoupling resonator that connects at least two resonators, in particular frequency resonators, to one another such that, for example, a ring of resonators results. In this manner, an overcoupling for the microwave filter may be performed. The two resonators may be connected via an additional coupling resonator or via a chain of additional resonators. The overcoupling resonator may be a coupling resonator. The overcoupling resonator may be an adjustable resonator. The prefix of the overcoupling may be positive or negative depending on the resonance frequency of the coupling resonator.

Other complex arrangements may also be constructed with the aid of the microwave filter.

Another aspect of the invention relates to a signal multiplexer for a microwave signal.

According to one embodiment of the invention, the signal multiplexer is designed to split the microwave signal into a plurality of band signals. The signal multiplexer comprises a plurality of microwave filters as described above and below that are designed so as to filter the band signals.

Another aspect of the invention relates to the use of a microwave filter as described above and below in a communication satellite.

Exemplary embodiments of the invention shall be described in detail in the following with reference to the attached figures.

BRIEF DESCRIPTION OF THE FIGURES

Identical or similar parts are assigned the same reference characters as a matter of principle.

DETAILED DESCRIPTION OF EXEMPLARY EMBODIMENTS

Figure 1:
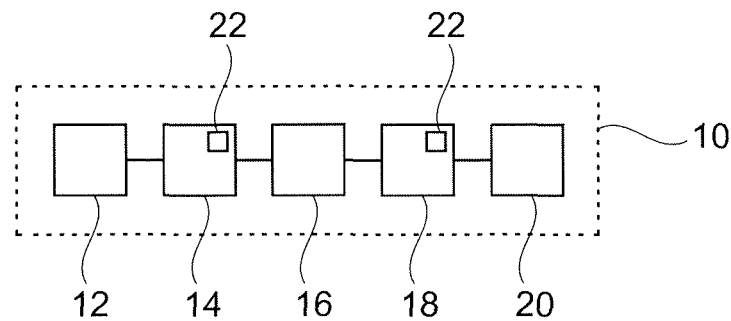
FIG. 1 shows a schematic view of a communications satellite according to one embodiment of the invention.

FIG. 1 schematically shows signal processing in a communications satellite 10. An input antenna 12 receives a signal, which is split by a multiplexer 14 into a plurality of individual signals that are amplified in an amplifier 16. The amplified signals are recombined to one signal by another multiplexer (i.e., a demultiplexer) 18, which is transmitted by another antenna 20.

In order to filter the individual signals, the multiplexers 14, 18 may comprise one or more microwave filters 22 as described above and below.

Figure 2:
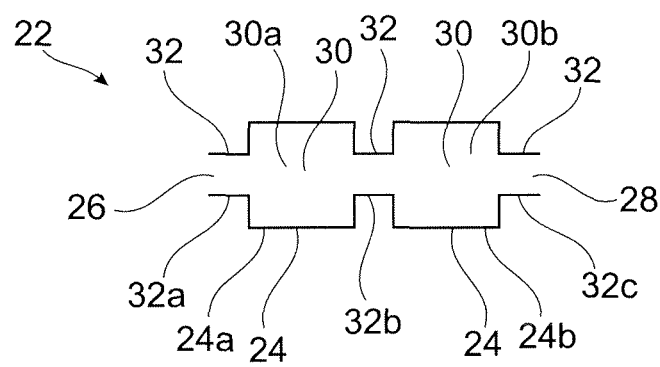
FIG. 2 shows a schematic view of a microwave filter.

FIG. 2 shows a microwave filter 22 comprising two resonators 24, 24a, 24b. The microwave filter 22 comprises an input 26 and an output 28, each of which may be connected to a waveguide filter, for example, the waveguide filter of a multiplexer 14, 18.

Fundamentally, the microwave filter 22 is a cavity that is comprised of various hollows. The two resonators 24a, 24b each comprise a volume 30, 30a, 30b that is connected to the other volumes and/or to the input 26 or output 28 via coupling irises 32, 32a, 32b, 32c.

The microwave filter 22 shown in FIG. 2 is also referred to as a dual-circuit filter because it comprises precisely two resonators 24a, 24b by means of which the transmission frequency of the filter 22 is established. The transmission frequency of a passband of the filter 22 (which may be defined, for example, over the middle of the passband) is essentially a function of the resonance frequencies of the resonators 24a, 24b.

Both resonators 24a, 24b may have resonance frequencies that are detuned from one another, whereby the rate of change of the passband of the filter 22 is increased. Here, the resonance frequency of a resonator 24a, 24b is dependent upon the volume 30a, 30b of the respective resonator.

It is possible to create microwave filters that comprise only one resonator 24 (so-called single-circuit filters) which then have a lower rate of change. It is also possible to couple three or more resonators 24, i.e., to create triple-circuit filters having three resonators 24 or quadruple-circuit filters having four resonators 24, etc.

The bandwidth of a microwave filter 22 is essentially a function of the quantity of the energy coupling between the resonators 24. The amount of coupling energy is determined by the size of the coupling iris 32 between the resonators 24.

In general, a coupling iris 32 is modeled with the aid of an impedance inverter, which inverts the connected impedance in accordance with:

$$Z_{in} = \frac{J^2}{Z_L} = \frac{\omega^2 C^2}{Z_L}$$

Figures 3, 4:
FIG. 3 shows a circuit diagram symbol for an impedance inverter.
FIG. 4 shows an equivalent circuit diagram for an impedance inverter.

FIG. 3 shows a circuit diagram for an impedance inverter. FIG. 4 shows an equivalent circuit diagram for realizing an impedance inverter having a capacity C. The capacity C is implemented in a waveguide realization with a capacitive coupling iris 32.

FIG. 4 further implies that negative conductor lengths $-\phi$ may be realized by shortening the connected resonators. Using negative conductor lengths $-\phi$, a displacement of the transmission frequency of the filter 22 due to coupling with the irises 32 may be counteracted.

Figure 5:
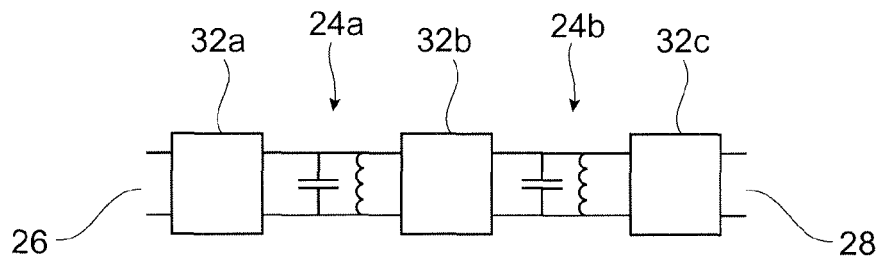
FIG. 5 shows an equivalent circuit diagram for the microwave filter shown in FIG. 2.

FIG. 5 shows an equivalent circuit diagram for the microwave filter 22 from FIG. 2. The capacitive coupling irises 32a, 32b, 32c are shown as impedance inverters, and the resonators 24a, 24b are represented by an oscillator circuit having a capacity and an inductivity.

Figure 6:
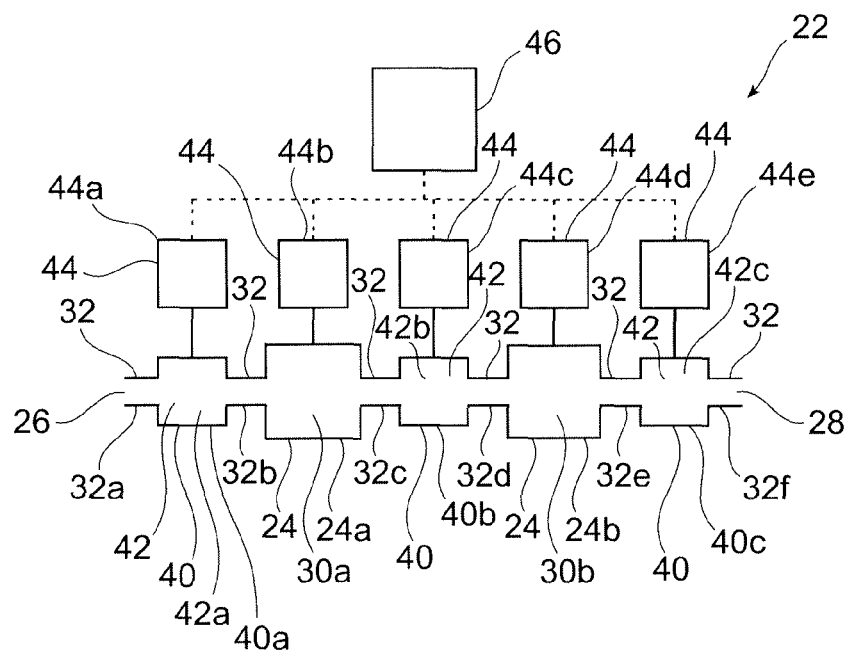
FIG. 6 schematically shows a microwave filter according to one embodiment of the invention
Figure 7:
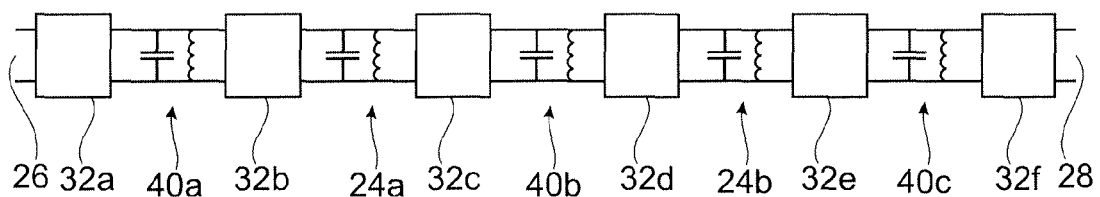
FIG. 7 shows an equivalent circuit diagram for the microwave filter shown in FIG. 6

FIG. 6 schematically shows an adjustable microwave filter 22 whose bandwidth and whose medium frequency and/or transmission frequency may be actively adjusted. FIG. 7 shows an equivalent circuit diagram analogous to FIG. 5 for the microwave filter 22 from FIG. 6.

In order to create an adjustable microwave filter 22, the coupling irises 32 from FIG. 2 are replaced with a structure comprising one coupling iris 32, one adjustable coupling resonator 40, and one coupling iris 32. The coupling may then be adjusted by the resonance frequency of the coupling resonator 40.

In the case of a dual-circuit filter 22 having two adjustable frequency resonators 24a, 24b shown here, the following structure results:

The first frequency resonator 24a is connected to the input 26 via a coupling resonator 40a. Between the input 26 and the coupling resonator 40a is a coupling iris 32a. Between the coupling resonator 40a and the frequency resonator is a coupling iris 32b.

The first frequency resonator 24a is connected to the second frequency resonator 24b via a coupling resonator 40b. Between the first frequency resonator 24a and the coupling resonator 40b is a coupling iris 32c. Between the coupling resonator 40b and the second frequency resonator 24b is a coupling iris 32d.

The microwave filter 22 shown in FIG. 6 may be regarded as a dual-circuit filter 22 because it comprises (precisely) two frequency resonators 24a, 24b. In the case of a single-circuit filter having only one frequency resonator 24a, the coupling iris 32d would provide an output of the filter.

Microwave filters having a higher number of circuits result from the additional attachment of more pairs comprising a frequency resonator 24 and a coupling resonator 40.

In the case of a dual-circuit filter 22 shown here, the second frequency resonator 24b is connected to the output 28 via a coupling resonator 40c. Between the second frequency resonator 24b and the coupling resonator 40c is a coupling iris 32e. Between the coupling resonator 40c and the output is a coupling iris 32f.

The resonators 24 and 40 are adjustable by virtue of the fact that their volume 30 and 42, respectively, may be changed by means of an actuator 44. An actuator 44b, 44d, 44a, 44c, and 44e is assigned respectively to each resonator 24a, 24b, 40a, 40b, and 40c, which is able to change the respective volume 30a, 30b, 42a, 42b, and 42c, for example, by moving a plate slide.

The actuators 44, for example, multiphase motors, can be activated by a control 46 that receives a transmission frequency and a bandwidth as input parameters and, from these, calculates the volumes 30, 42 to be set.

The (adjustable) resonance frequency of the coupling resonators 40a, 40b, 40c may be considerably detuned relative to the medium frequency of the filter 22. The coupling resonators 40a, 40b, 40c may therefore have a (respective) volume 42a, 42b, 42c that is less than the volume 30a, 30b of a frequency resonator 24a, 24b.

Figure 8:
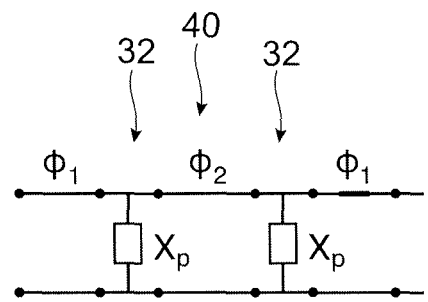
FIG. 8 shows an additional equivalent circuit diagram for the microwave filter from FIG. 6.

An equivalent circuit diagram for the adjustable coupling having a coupling resonator 40 with two coupling irises 32 is shown in FIG. 8.

The conductor length $\phi_2$ represents the coupling resonator 40, the reactance $X_p$ the non-adjustable irises 32. The conductor length $\phi_1$ represents the shortening of the connected resonators analogously to the inverter model from FIG. 4.

Figure 9:
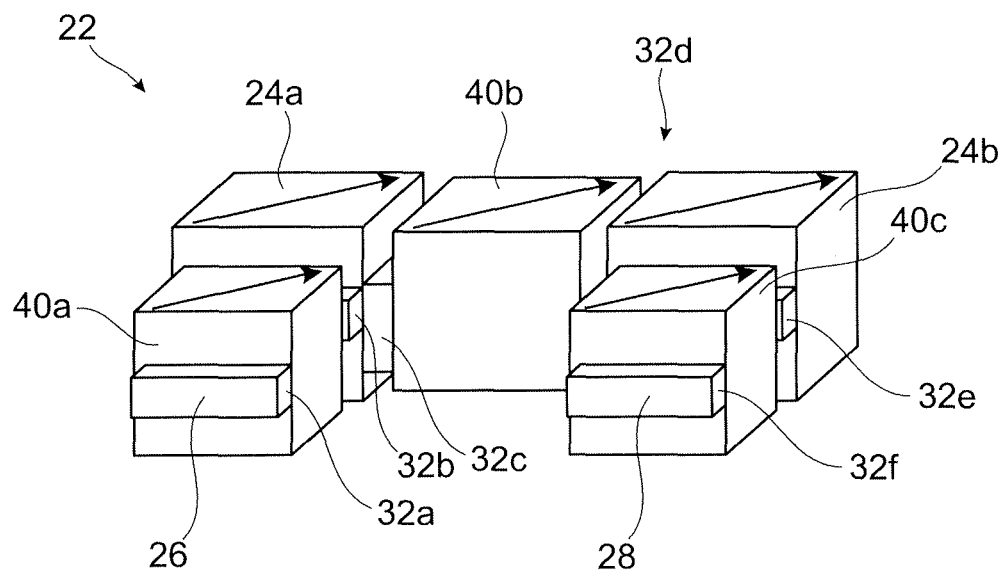
FIG. 9 schematically shows a spatial arrangement of a microwave filter according to one embodiment of the invention.

FIG. 9 schematically shows a possible spatial arrangement of the coupling irises 32 and the resonators 24, 40 of a microwave filter 22.

All resonators 24a, 24b, 40a, 40b, 40c are disposed in one plane and may, for example, be embodied as a combined component assembly. The two frequency resonators 24a, 24b that accommodate the coupling resonator 40b between one another are arranged in series.

Before each of the frequency resonators 24a, 24b are the coupling resonators 40a and 40c. The input 26 and the output 28 are located on one side of the arrangement. Between the resonators 24, 40 (and the input 26 as well as the output 28) are the non-adjustable or unchangeable coupling irises 32a to 32f. The actuators 44 may be arranged above the plane of the resonators.

Figure 10:
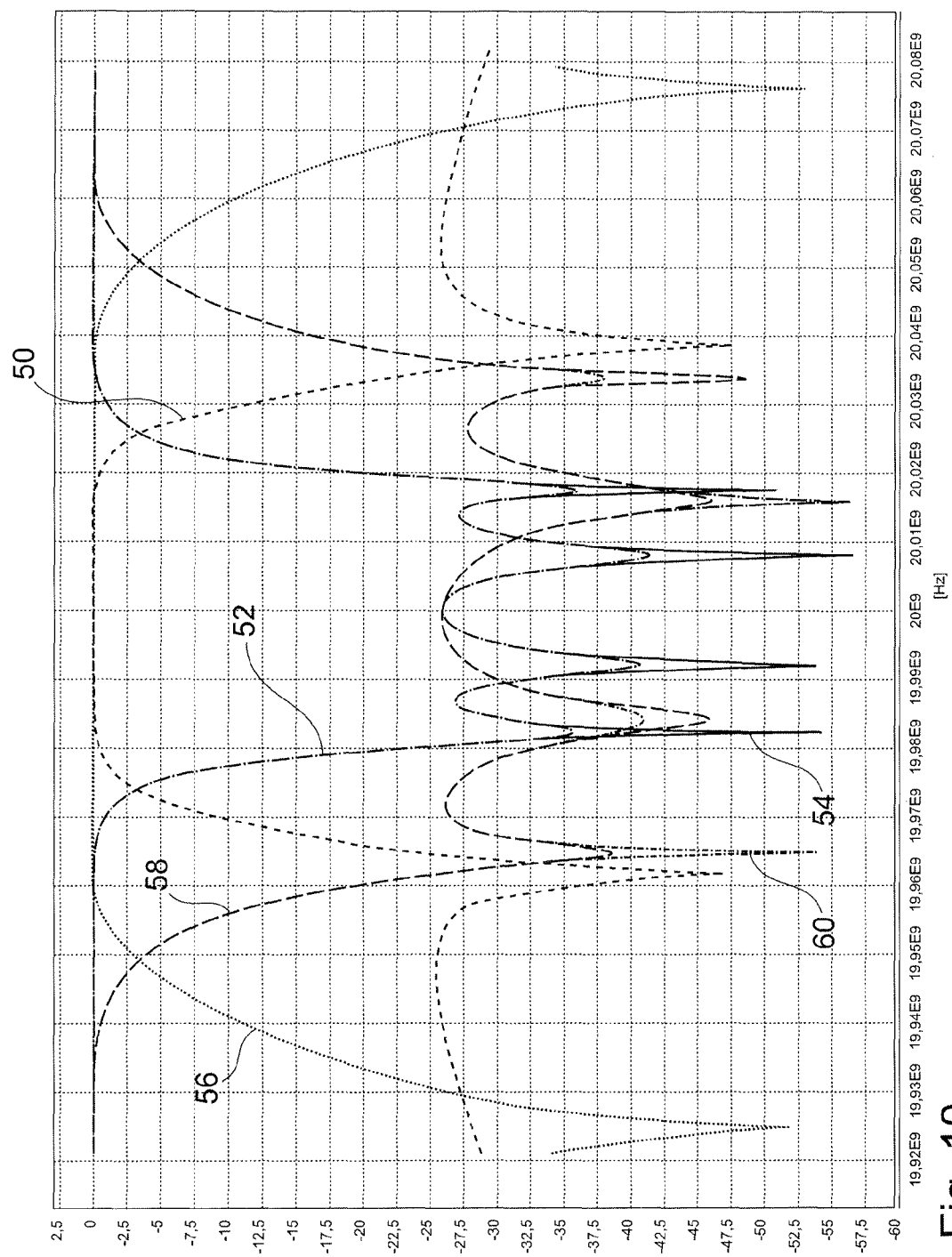
FIG. 10 shows a diagram with transmission curves and reflection curves for a microwave filter according to one embodiment of the invention.

FIG. 10 shows a diagram with transmission curves and reflection curves for a microwave filter 22 embodied as a quadruple-circuit filter. In the diagram, the frequency is recorded on the x axis and the transmission or reflection ability is recorded on the y axis.

In a first setting of the microwave filter 22, the volumes 30, 42 (or the frequency lengths of the resonators 24, 40) are set in such a way that a transmission curve 50 results with a bandwidth of approximately 36 MHz and a middle frequency of approximately 20 GHz. Two reflection curves 52, 54 to the transmission curve 50 are shown, which depict the reflection behavior of the filter 22 at the input 26 and the output 28.

In a second setting of the microwave filter 22, the volumes 30, 42 (or the frequency lengths of the resonators 24, 40) are set in such a way that a transmission curve 56 results with a bandwidth of approximately 72 MHz and a medium frequency of approximately 20 GHz. Two reflection curves 58, 60 to the transmission curve 56 are also shown, which depict the reflection behavior of the filter 22 at the input 26 and the output 28.

Between the settings, the effective lengths of the coupling resonators and the frequency resonators 24 differ. The change in length that is required to change the setting lies in the range of one millimeter.

Figure 11:
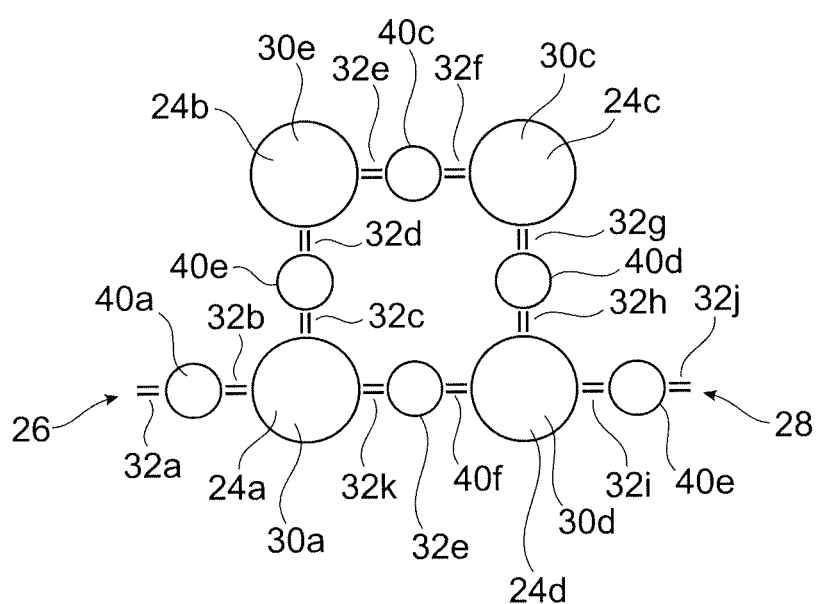
FIG. 11 schematically shows a microwave filter according to an additional embodiment of the invention.

FIG. 11 shows a microwave filter 22 comprising four frequency resonators 24a, 24b, 24c, 24d and six coupling resonators 40a, 40b, 40c, 40d, 40e, 40f that are connected in an alternating fashion via coupling kiss 32a to 32l.

The microwave filter 22 from FIG. 11 has an overcoupling. To this end, a coupling resonator 40f is embodied as an overcoupling resonator 40f in that it connects two frequency resonators 24a, 24d to one another in such a way that a ring of resonators results.

The frequency resonators 24a to 24d are used for setting the medium frequency, the coupling resonators 40a to 40f are used for setting the coupling energy and thus the bandwidth of the microwave filter 22.

The overcoupling resonator 40f may, depending on the resonance frequency, represent a positive or negative overcoupling. The coupling kiss 32k, 32l of the overcoupling resonator 40f are kept constant when setting the bandwidth. The adjustment of the coupling occurs by setting the resonance frequency of the resonator 40f.

Additionally, it should be noted here that "comprising" does not exclude any other elements or steps and "a" or "one" does not exclude a plurality. Moreover, it should be noted that features or steps that are described with reference to one of the exemplary embodiments above may also be used in combination with other features or steps of other exemplary embodiments described above. Reference characters in the claims are not to be viewed as limitations.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A microwave filter for a cavity conductor, with the microwave filter comprising:
    a first adjustable coupling resonator connected to an input of the microwave filter via a first coupling iris;
    a first frequency resonator configured to establish a transmission frequency of the microwave filter, the first frequency resonator is connected to the first adjustable coupling resonator via a second coupling iris; and
    a second adjustable coupling resonator connected to the first frequency resonator via a third coupling iris.

2. The microwave filter according to claim 1, further comprising:
    a second frequency resonator configured to establish a transmission frequency of the microwave filter, the second frequency resonator is connected to the first frequency resonator via the second adjustable coupling resonator; and
    a third adjustable coupling resonator connected to the second frequency resonator.

3. The microwave filter according to claim 1, wherein the microwave filter comprises a plurality of frequency resonators and a coupling resonator coupled between each of the plurality of frequency resonators.

4. The microwave filter according to claim 2, wherein at least one of the first and second frequency resonators is adjustable.

5. The microwave filter according to claim 2, wherein at least one of the first and second adjustable coupling resonators or at least one of the first and second frequency resonators comprises an actuator configured to adjust a volume of the respective resonator.

6. The microwave filter according to claim 5, wherein the actuator is an electromechanical actuator.

7. The microwave filter according to claim 2, wherein at least one of the first and second frequency resonators is configured to operate in a TE011 mode.

8. The microwave filter according to claim 1, wherein at least one of the first and second adjustable coupling resonators is configured to operate in a TE011 mode or in a TE111 mode.

9. The microwave filter according to claim 1, wherein a resonance frequency of the first frequency resonator deviates from the transmission frequency by less than 10% of a bandwidth of a transmission frequency band, and wherein a resonance frequency of one of the first and second adjustable coupling resonators deviates from the transmission frequency by more than half a bandwidth of the transmission frequency band.

10. The microwave filter according to claim 2, further comprising:
    at least one overcoupling resonator that connects the first and second frequency resonators to each other in such a way that an overcoupling results.

11. The microwave filter according to claim 1, wherein a volume of one of the first and second adjustable coupling resonators is less than a volume of the first frequency resonator.

12. The microwave filter according to claim 1, wherein the first and second frequency resonators are configured to be adjustable to different resonance frequencies, or wherein at the first and second adjustable coupling resonators are configured to be adjustable to different resonance frequencies.

13. The microwave filter according to claim 1, wherein the microwave filter is a component of a communications satellite.

14. A signal multiplexer for a microwave signal, the signal multiplexer comprising:
- a microwave filter configured to filter band signals, the microwave filter comprising a first adjustable coupling resonator connected to an input of the microwave filter via a first coupling iris;
- a first frequency resonator configured to establish a transmission frequency of the microwave filter, the first frequency resonator is connected to the first adjustable coupling resonator via a second coupling iris; and
- a second adjustable coupling resonator connected to the first frequency resonator via a third coupling iris, wherein the signal multiplexer is configured to split embodied for the purpose of splitting the microwave signal into a plurality of band signals.

* * * * *